(12) United States Patent
Tailhades et al.

(10) Patent No.: US 8,017,911 B2
(45) Date of Patent: Sep. 13, 2011

(54) USE OF SPINEL FERRITES AS SENSITIVE MATERIAL FOR BOLOMETRIC INFRARED DETECTOR DEVICES

(75) Inventors: Philippe Tailhades, Saint-Orens de Gameville (FR); Lionel Presmanes, Castanet (FR); Corinne Bonningue, Toulouse (FR); Jean-Louis Ouvrier-Buffet, Sevrier (FR); Astrid Astier, Voreppe (FR); Stephanie Capdeville, Toulouse (FR); Claire Vialle, Saint Egreve (FR); Pierre Imperinetti, Seyssins (FR)

(73) Assignees: Universite Paul Sabatier (Toulouse III), Toulouse (FR); Centre National de la Recherche Scientifique, Paris (FR); Commissariat a l'Energie Atomique, Paris (FR)

( * ) Notice: Subject to any disclaimer, the term of this patent is extended or adjusted under 35 U.S.C. 154(b) by 237 days.

(21) Appl. No.: 10/582,520

(22) PCT Filed: Dec. 15, 2004

(86) PCT No.: PCT/FR2004/050695
§ 371 (c)(1),
(2), (4) Date: Sep. 28, 2006

(87) PCT Pub. No.: WO2005/064294
PCT Pub. Date: Jul. 14, 2005

(65) Prior Publication Data
US 2007/0120059 A1    May 31, 2007

(30) Foreign Application Priority Data
Dec. 22, 2003  (FR) ..................... 03 15190

(51) Int. Cl.
*G01J 5/02*  (2006.01)

(52) U.S. Cl. .................. 250/340; 250/338.1; 250/341.1
(58) Field of Classification Search ............... 250/338.1, 250/341.1
See application file for complete search history.

(56) References Cited

U.S. PATENT DOCUMENTS 4,531,110 A * 7/1985 Johnson et al. ............. 338/22 R
5,821,598 A * 10/1998 Butler et al. ................. 257/467
5,854,587 A   12/1998 Horwitz et al.
(Continued)

FOREIGN PATENT DOCUMENTS
FR         2.150.608         4/1973
(Continued)

OTHER PUBLICATIONS

Appendix B, "Ion Acoustic Waves and Langmuir Waves," p. 131-136. accessed Jul. 1, 2009: <http://mr-fusion.hellblazer.com/pdfs/ion-acoustic-waves-and-langmuir-waves.pdf>.*

(Continued)

*Primary Examiner* — David Porta
*Assistant Examiner* — Casey Bryant
(74) *Attorney, Agent, or Firm* — Oliff & Berridge, PLC

(57) ABSTRACT

The present invention relates to the use as a sensitive material in a thin layer for bolometric detection of infrared radiation, of a material having a spinel ferrite structure of chemical composition, ignoring doping agents if any are present, satisfying empirical formula I:

$$Fe_{3-(x+y)}M_xA_yO_{4+\delta}.$$

The invention also provides a bolometric device for detecting infrared radiation or for infrared imaging, and including at least one sensor provided with a sensitive element in the form of a thin layer as defined above.

17 Claims, 3 Drawing Sheets

A

B

U.S. PATENT DOCUMENTS

| | | | | |
|---|---|---|---|---|
| 5,962,854 | A * | 10/1999 | Endo | 250/349 |
| 6,133,569 | A * | 10/2000 | Shoda et al. | 250/332 |
| 6,194,722 | B1 * | 2/2001 | Fiorini et al. | 250/338.1 |
| 6,359,276 | B1 * | 3/2002 | Tu | 250/338.1 |
| 2010/0065743 | A1 * | 3/2010 | Tailhades et al. | 250/338.3 |
| 2010/0184245 | A1 * | 7/2010 | Ouvrier-Buffet et al. | 438/59 |

FOREIGN PATENT DOCUMENTS

| | | |
|---|---|---|
| FR | 2864065 A1 * | 6/2005 |
| JP | A-10-163510 | 6/1998 |
| JP | A-2002-250655 | 9/2002 |

OTHER PUBLICATIONS

Torii et al. (1996). "Chemical Processing and Characterization of Spinel-Type Thermistor Powder in the Mn-Ni-Fe Oxide System." Journal of Materials Science 31: p. 2603-7.*

Nikolic et al. "Far Infrared Reflectance of Sintered Nickel Manganite Samples for Negative Temperature Coefficient Thermistors." Materials Research Bulletin 42 (2007): p. 1492-8.*

Baliga, S. et al., "Sputtered films thermistor IR detector," Proc. IEEE Mohawk Valley Dual-Use Technology and Applied Conference, SPIE vol. 2225, pp. 72-78, 1993.

* cited by examiner

USE OF SPINEL FERRITES AS SENSITIVE MATERIAL FOR BOLOMETRIC INFRARED DETECTOR DEVICES

The invention relates to the use of spinel ferrites as sensitive material for bolometric devices for use in detecting infrared radiation.

Bolometric detectors comprise a sensitive element based on a material presenting electrical resistance that varies with temperature.

Thermal devices for detecting infrared are capable of absorbing incident infrared radiation and of converting it into heat. The resulting increase in the temperature of the sensitive element leads to variation in the resistance of said sensitive element. When associated with a suitable electrical circuit, of known type, such devices thus enable a change in temperature to be converted in an electrical signal.

At present, for infrared imaging, infrared cameras make use, amongst other things, of microbolometers comprising a plurality of microsensors disposed in the form of a matrix array of pixels. Each microsensor absorbs the infrared radiation that strikes it, and the resulting variations in the temperature of the sensitive material, present in the form of a thin layer in each microsensor, leads to a variation in the electrical resistance of said sensitive material. A measurement system, of known type, evaluates the variations in resistance and converts them into electrical signals. The electrical signals can then be converted into images using an appropriate imaging device, of known type.

Infrared imaging and detection systems are known presenting good sensitivity that make use of sensitive materials based on "HgCdTe" or "YBaCuO". Nevertheless, those systems present the drawback of needing to be cooled to the temperature of liquid nitrogen.

There also exist "non-cooled" bolometric devices, in which operation is based in particular on variations in the electrical properties of amorphous silicon or of vanadium oxide. Nevertheless, those devices are less sensitive than cooled devices.

Materials based on perovskites have also been recommended. They potentially present advantageous sensitivity, but that is counterbalanced by intense electronic noise.

At present there thus exists a need to obtain non-cooled bolometric devices for detecting infrared radiation that present good sensitivity and that enable electronic noise to be minimized.

It has now been discovered that certain iron-based spinel oxides of transition metals can be used in the form of thin layers as sensitive material for bolometric infrared detector devices. These materials, which are spinel ferrites, possess moderate resistivity and are very sensitive to temperature. They therefore enable electrical measurements to be made that present a high signal to noise ratio, and advantage can be taken of their sensitivity to detect low-intensity infrared radiation, in particular in the 8 micrometer (μm) to 12 μm waveband.

Spinel structure oxides in which manganese is the majority element are described for use as thermistors as opposed to infrared detectors in patent applications JP 2000-348905 A2 and EP 1 058 276 A2. Nevertheless, those oxides are manganites, and in this respect different from ferrites. The article by A. Doctor, S. Baliga, M. Rost entitled "Sputtered films thermistor IR detector", Proc. IEEE Mohawk Valley Dual-Use Technology and Applied Conference, pp. 153-156, 1993, proposes bolometric infrared detectors using thin layers of spinel oxides based on nickel, on cobalt, and on manganese. That article describes an embodiment and a use of such thin layer IR detectors. U.S. Pat. No. 5,854,587 describes the use of pervoskite type manganites as sensitive material for bolometers.

Thus, in one of its aspects, the invention provides the use as a sensitive material in a thin layer for bolometric detection of infrared radiation, of a material having a spinel ferrite structure of chemical composition, ignoring doping agents if any are present, satisfying empirical formula I:

$$Fe_{3-(x+y)}M_xA_yO_{4+\delta} \qquad (I)$$

in which iron is the majority metallic element;

M presents a metal or a combination of two or more transition metals other than iron;

A represents at least one metal selected from magnesium and aluminum;

the metals and the oxygen being in the form of ions;

x represents the number of metal ions M, whether identical or different metals;

y represents the number of metal ions A;

x may lie in the range 0 to 2, and whatever x, $x < 3-x-y$, y may lie in the range 0 to 0.5; and δ represents 0 or a positive number that is sufficiently small for the substance of formula I to contain at least one metal present in the form of ions having two different oxidation states and situated on the same sublattice of the spinel structure.

In other words, substances of formula I with δ not equal to zero are partial and non-total oxidation products of spinel ferrites for which δ=0, and which are known as stoichiometric spinel ferrites. The reasons for this only-partial oxidation characteristic appear below.

In another of its aspects, the invention also provides a bolometric device for detecting infrared radiation or for infrared imaging, including at least one sensor provided with a sensitive element in the form of a thin layer of a spinel ferrite structure material in accordance with the present invention.

In another of its aspects, the invention also provides a method of detecting infrared radiation or of producing infrared imaging by means of a bolometric device capable of absorbing incident radiation, of converting it into heat, and of communicating a fraction of the heat produced to a sensitive element of resistivity that varies with temperature, in which said device is as defined below.

DESCRIPTION OF THE INVENTION

Iron oxides are ionic compounds, with the metals being in the form of cations and the oxygen in the form of anions $O^{2-}$.

In formula I of the invention, Fe represents all iron cations (ferrous and ferric).

In that formula, M represents a metal other than iron or a combination of two or more metals other than iron.

In other words, M may be symbolized in general formula I by the sequence $M_{x0}M'_{x1}M''_{x2}$ in which M, M', M", ... represent transition metals other than iron, and the subscripts x0, x1, and x2 represent the numbers of ions of M, M', M", ....

In particular, M can be a metal selected from Co, Cu, Mn, Zn, Ni, V, Cr, Mo, W, Ti, Zr, Hf, and rare earths presenting an ionic radius that is compatible with being integrated in the spinel structure, or a combination thereof. In particular, the ionic radius must be small enough and must generally be less than 0.1 nanometers (nm).

Particular mention can be made of ferrites of formula I in which M is a metal selected from Co, Cu, Mn, Zn, Ni, and Ti, including those in which y is equal to zero, or a combination thereof.

Various known properties of spinel oxides of transition metals are summarized below using spinel ferrites by way of example.

It is known that the structure of the ($MgAl_2O_4$) spinel is also that of magnetite $Fe_3O_4$. It is also known that oxidizing magnetite leads to iron sesquioxide $Fe_2O_3$, which conserves the crystal structure of magnetite in the form known as $\gamma\text{-}Fe_2O_3$ up to a temperature of about 400° C.-500° C., at which temperature the $\gamma\text{-}Fe_2O_3$ oxide transforms into $\alpha\text{-}Fe_2O_3$, which presents the structure of corundum.

It is also known that the structure of $\gamma\text{-}Fe_2O_3$ that is obtained by oxidizing magnetite is a spinel structure with vacancies. While $Fe_3O_4$ is being oxidized, the lattice of $O^{2-}$ anions remains unchanged. Negative oxygen ions are absorbed at the surface of the oxide. They become arranged in an organization identical to that existing in the magnetite lattice, of which they constitute an extension. The negative charge contributed in this way is compensated by oxidizing ferrous ions into ferric ions which migrate from the inside of the crystal towards the new arrangement of oxygen anions for which they provide cohesion by establishing bonds between the $Fe^{3+}$ cations and the $O^{2-}$ anions. At the end of oxidation, the spinel type structure is conserved. Nevertheless, the cation/anion ratio, which was initially equal to ¾, has become smaller, given the provision of oxygen anions. The crystal of the oxidized substance thus has sites that would normally be occupied by metallic anions (in the oxide $Fe_3O_4$) that have become vacant, since they have been abandoned by the cations that have migrated to the surfaces. These sites are also called vacancies.

So-called stoichiometric spinel ferrites of the $X_aFe_{3-a}O_4$ type in which X represents at least one divalent metal and a<1, can, like magnetite, be transformed into spinel oxides with vacancies, in particular by being oxidized.

It is also known that by introducing various substituents into spinel ferrites, and in particular metals having multiple valency states, it is possible to create vacancies or to vary the number thereof.

For example, it is possible to replace some of the $Fe^{2+}$ ions with trivalent ions, without changing the amount of cationic charge balancing the anionic charge of the oxygen ions in the lattice, e.g. by taking three $Fe^{2+}$ ions and replacing them with two trivalent ions. Under such circumstances, three ion cations are replaced by two ions only, thereby creating a vacancy.

Conversely, if $Fe^{3+}$ ions are replaced with divalent ions, the only way of conserving the amount of cationic charge is to replace two $Fe^{3+}$ cations by three divalent cations, providing use can be made of a vacancy that is already present in the lattice. Thus, replacing $Fe^{3+}$ with a divalent cation leads to a reduction in the number of vacancies.

The term "cation-deficient spinel ferrites with vacancies" (i.e. superstoichiometric spinel ferrites) is used to designate spinel type compounds based on $\gamma\text{-}Fe_2O_3$ modified by replacing a fraction of the ferric ions, and possibly of the vacancies, with metallic cations other than ferric cations. To represent superstoichiometric spinel oxides with vacancies while maintaining the number of metallic atoms in the formula equal to 3 (as in the formula $Fe_3O_4$), it is necessary to write their formulae in a form of the type $X_xFe_{3-x}O_{4+\delta}$, where Fe represents a trivalent iron, X represents at least one metallic cation other than a ferric cation, x is the number of X cations, such that the sum of the number of X cations plus the number of ferric cations is equal to 3, O represents an $O^2$-anion, and $\delta$ is a positive number.

Another way of representing superstoichiometric spinel oxides with vacancies, this time maintaining a number of oxygen atoms equal to 4 (as in the formula $Fe_3O_4$) is to write the formula in an equivalent form specifically mentioning the vacancies:

in which the symbol □ represents the vacancies.

Thus, stoichiometric spinel ferrites and spinel ferrites with a moderate number of vacancies (incompletely oxidized) include, in oxide form, at least one metal that is present in the form of two cations having different ionization states. These substances are therefore oxidizable, with such oxidation occurring with vacancies being formed.

In the above formulae, the value of the number represented by $\delta$ depends on the nature of the metals present and on the conditions of the oxidation treatment. The number $\delta$ corresponds to the number (above 4) of $O^{2-}$ anions that are needed to compensate for the increase in the charge of the various cations that have been oxidized, in order to maintain electrical neutrality. There is no practical advantage in determining $\delta$ (or which amounts to the same thing, in determining the number of vacancies). Including $\delta$ in the expression for the number of oxygen atoms in the empirical formula I serves above all to provide qualitative information, since it makes it possible to understand immediately that when $\delta$ is not zero, the empirical formula I represents a spinel ferrite with vacancies. In ferrites of formula I with vacancies, the number $\delta$ is generally less than 0.8 and more particularly less than about 0.5, so they qualify as ferrites with vacancies.

A thin layer of the sensitive material of the invention can be obtained on an appropriate substrate by performing the usual techniques, in particular by cathode sputtering, starting with a target obtained in conventional manner by sintering a mixture of powders of the oxides of the various metals selected, possibly together with doping agents (which themselves may possibly be in the form of oxides).

The cathode sputtering technique is a method of depositing thin layers of any material on a substrate within an enclosure containing an inert gas, generally argon maintained at low pressure. Under the influence of an electric field, the gas is ionized so as to form a luminescent plasma, and the impact of incident ions on the "target material" or "target" that is secured to an electrode that is subjected to a cathode potential gives rise by a mechanical effect to atoms being expelled from the surface of the material, which atoms become deposited on the substrate that is placed facing the target. In general, the composition of the deposit is close to the composition of the target material.

The use of alternating voltages, in particular at high frequency, presents various advantages, in particular for sputtering insulating materials, and the possibility of using triggering voltages that are smaller than when using direct current (DC) voltages. Such a method is referred to as radio frequency (RF) cathode sputtering.

By superposing a magnetic field in the vicinity of the cathode on the electric field (by using a magnetron cathode), it is possible to make the trajectories followed by the electrons of the plasma more complicated, thereby increasing the extent to which the gas is ionized, thus making it possible in particular to obtain deposition at a speed that is increased for given application of power.

When it is desired to deposit metal oxides while avoiding depositing forms that are totally or strongly oxidized, it is possible to operate at low argon pressures, e.g. of 0.5 pascals (Pa). Conversely, if it is desired to obtain a deposit of an oxidized form, then it is possible to operate in a mixture of argon and of oxygen.

Deposition can also be performed using other known techniques for generating a vapor phase, such as, for example: vacuum evaporation or laser ablation.

The thin layers of spinel ferrites used in the invention are polycrystalline layers.

Preferably, the deposited thin layer has a composition close to that of stoichiometric ferrite (corresponding to δ=0 or close to 0). By depositing a material having substantially the composition of stoichiometric ferrite under a non-oxidizing atmosphere, thin layers are obtained that posses the spinel structure presenting a crystal state that is more satisfactory than when depositing a ferrite that is more oxidized and that has the composition that is desired for the final product. In particular, deposition in the form of a ferrite that is substantially stoichiometric makes it possible to obtain a thin layer of ferrite having crystallites of dimensions that are satisfactory. It is thus possible to obtain thin films of thickness lying in the range 10 nm to 500 nm, and in particular 50 nm to 150 nm that are constituted by crystallites of mean size lying in the range about 5 nm to about 50 nm, and in particular lying in the range about 10 nm to about 30 nm. Because of the small thickness of the layer, these dimensional characteristics make it possible to minimize the thermal inertia of the sensitive layer, and because of the small size of the crystallites, this makes it possible to minimize the dispersion in electronic noise from one pixel to another when performing bolometric detection. For example, by performing deposition using RF cathode sputtering under argon at a pressure lying in the range 0.1 Pa to 2.5 Pa, it is possible to obtain ferrite compositions presenting the characteristics specified above.

The term "crystallite" is used to designate the microcrystals that make up the thin layer. These are crystalline domains that diffract X-rays in coherent manner. In other words, these are single crystals of mean dimensions that can easily be determined, in particular by transmission electron microscopy, by atomic force microscopy, or by X-ray diffraction.

In general, spinel ferrite compositions with vacancies can be modified using doping agents, not shown in formula I, and that do not necessarily form part of the crystal lattice. The use of a large number of doping agents has been described for compounds of this type. The presence of doping agents can, for example, make it easier to make crystallization more regular. Generally, doping agents are present in the form of oxides at a concentration by weight that does not exceed 1% to 2% by weight relative to the weight of the spinel oxide. Doping agents may be constituted, for example silicon, phosphorous, boron, alkaline-earth metals (in particular Ca, Ba, Sr), alkali metals (e.g. Na, K, Li), gallium, germanium, arsenic, indium, antimony, bismuth, lead, etc.

When depositing oxide mixtures having substantially the composition of stoichiometric type spinel oxides, which deposition may optionally be followed by heat treatment in an oxidizing atmosphere, the deposited thin layer spontaneously adopts a spinel crystal structure.

After the thin layer having substantially the composition of a stoichiometric spinel oxide has been deposited, it is generally appropriate to perform oxidation treatment in order to cause vacancies to appear. The small thickness of the deposited layers and the small size of the crystallites facilitate oxidation at a moderate temperature, generally less than or equal to 300° C. During this oxidation treatment, the thin layer acquires spinel structure with vacancies, and it is observed that this oxidation treatment generally also makes it possible to increase the extent to which resistivity varies with temperature, i.e. the sensitivity property that is looked for in active materials for bolometric devices.

The spinel ferrites, whether stoichiometric or having vacancies, that are used in the invention have semiconductive properties. Their conductivity increases with temperature: they thus constitute substances that have a so-called "negative" temperature coefficient. Such substances are characterized by their activation energy Ea which is calculated in application of the following formula:

$$Ea^* = kB$$

where:
k is Boltzmann's constant; and
B is the energy constant corresponding to the slope of the curve plotting Log R as a function of 1/T, where R designates resistance and T temperature.

In particular, the activation energy Ea can be calculated from two resistances R1 and R2 measured respectively at temperatures T1 and T2:

$$Ea = k\frac{T1 \cdot T2}{T2 - T1}\log\left(\frac{R1}{R2}\right)$$

The sensitivity of a material for a bolometric detector is expressed using a temperature coefficient α that represents the derivative of its resistance relative to temperature, divided by resistance:

$$\alpha = \frac{dR}{dT} \cdot \frac{1}{R} \cdot 100 = \frac{Ea}{kT^2} \cdot 100$$

The coefficient α is expressed in percentage per kelvin (%·K$^{-1}$).

It is presently accepted that electrons can be conducted in the oxides of transition metals only between cations of a single element possessing ionization states that differ by unity and that are placed on a common sublattice of the spinel structure (Verwey's law). Conduction is performed by a transition mechanism that takes place in hops, and is commonly referred to as "hopping".

The oxidation of stoichiometric spinel ferrites into spinel ferrites with vacancies reduces the number of cationic pairs (in particular $Fe^{2+}$—$Fe^{3+}$ pairs) that make the hopping phenomenon possible, and therefore increases the resistivity of the material. For example, when magnetite is fully oxidized, the resulting substance, i.e. $\gamma$-$Fe_2O_3$, is completely insulating. It is therefore appropriate to avoid fully oxidizing the spinel ferrite since that would make the material non-conductive, and to do so by acting on the following factors:

the duration of the oxidizing heat treatment at a temperature that is generally less than 350° C., and in particular at a temperature that is less than or equal to 300° C.; and
the oxygen partial pressure.

In particular, it is possible to operate in air with the treatment taking place over a duration lying in the range 30 minutes (min) to 3 hours (h), for example.

Clearly it is necessary to avoid complete oxidation since that would increase resistance too much, with the material then being no longer conductive, as described above.

It is found that the oxidation treatment not only increases resistivity, but also generally increases the temperature coefficient α. It is thus possible by simple routine experiments to determine the oxidation treatment conditions that make it possible for a given composition in terms of metals possibly to obtain degrees of oxidation that give an optimum value for the coefficient α, or a value for a that is greater in absolute value than a predetermined threshold value (e.g. greater than $1\%\cdot K^{-1}$). In the same way, with such routine experiments, it is possible to select compositions of transition metals that make it possible to obtain advantageous resistivity properties, or to optimize the relative proportions of the metals in such compositions.

In a research stage, the method of obtaining a sensitive layer of spinel ferrite of the invention thus consists in depositing a layer having substantially the composition of a stoichiometric spinel ferrite, and in performing oxidation treatment thereon, where necessary, serving possibly to improve the value of $\alpha$, in order to select those compositions for which the absolute value of $\alpha$ is, for example, greater than $1\%\cdot K^{-1}$ or some other desired value, while conserving low resistivity and low electronic noise. The thin layer is generally deposited on one or more layers suitable for providing it with mechanical rigidity, absorbing infrared radiation, and providing electrical connections to the sensitive layer. The thin layer or all of the layers may be deposited on a sacrificial structure.

As specified above, another aspect of the invention provides a bolometric device for detecting infrared radiation or for performing infrared imaging, the device including at least one sensor provided with a sensitive element in the form of a thin layer of material as defined above.

Figure 2:
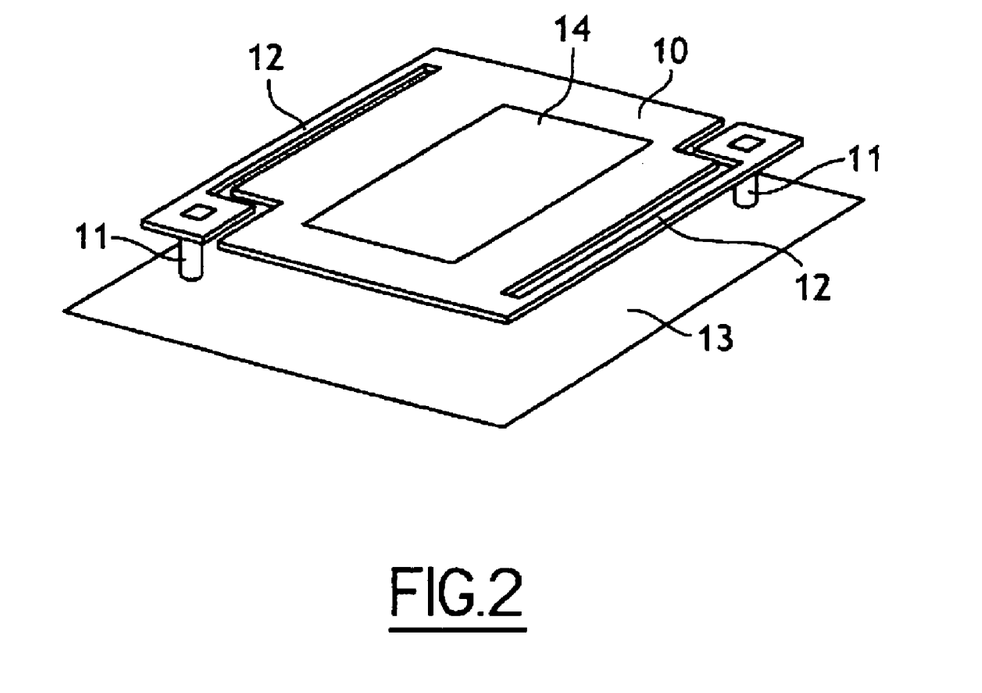
FIG. 2 is a simplified diagrammatic perspective view showing an embodiment of a bolometric device of the invention.

In a particular embodiment of the bolometric device of the invention, the sensor is inserted in a package having an inlet window that is transparent to infrared radiation, and comprises a membrane capable of absorbing infrared radiation and of converting it into heat, said membrane being disposed in such a manner as to be capable of being exposed to incident infrared radiation that has passed through the inlet window, and in such a manner as to transmit a fraction of the heat produced in this way to said sensitive element. FIG. 2 shows a simplified view of such a device.

The bolometric device shown therein comprises a fine membrane 10 capable of absorbing infrared radiation and suspended over a support 13 by means of anchor points 11. A sensitive layer 14 is deposited on the membrane 10. Under the effect of infrared radiation, the membrane heats up and transmits its temperature to the layer 14. The sensitive layer 14 is electrically connected to read elements (not shown) disposed on the substrate by means of a generally metallic layer (not shown) passing via the anchor points 11. The sensitivity of thermal detection is considerably improved by introducing insulating arms 12 between the support substrate and the membrane in order to limit heat losses therefrom. Variations in the resistivity of the sensitive layer are recorded via two electrodes connected to a suitable read circuit. The electrodes may either be coplanar, or else they may be facing (sandwiched).

In bolometric devices of the invention, the support substrate may be constituted by an electronic circuit integrated on a silicon wafer including firstly devices for stimulating and reading temperature variations, and secondly multiplexing components enabling signals from a plurality of bolometers to be put into a serial from and transmitted via a small number of outputs so as to be suitable for use in a conventional imaging system.

The membrane on which the thin layer of material of the invention is deposited can be constituted, for example, by one or more dielectric layers, in particular of SiO or SiN.

When there is only one layer, it may be partially covered by electrodes, in particular of TiN that present a high degree of absorption for infrared radiation. When there are two layers, the electrodes may either be applied to the surface of the outer layer or they may be enclosed between the two layers.

Figure 3:
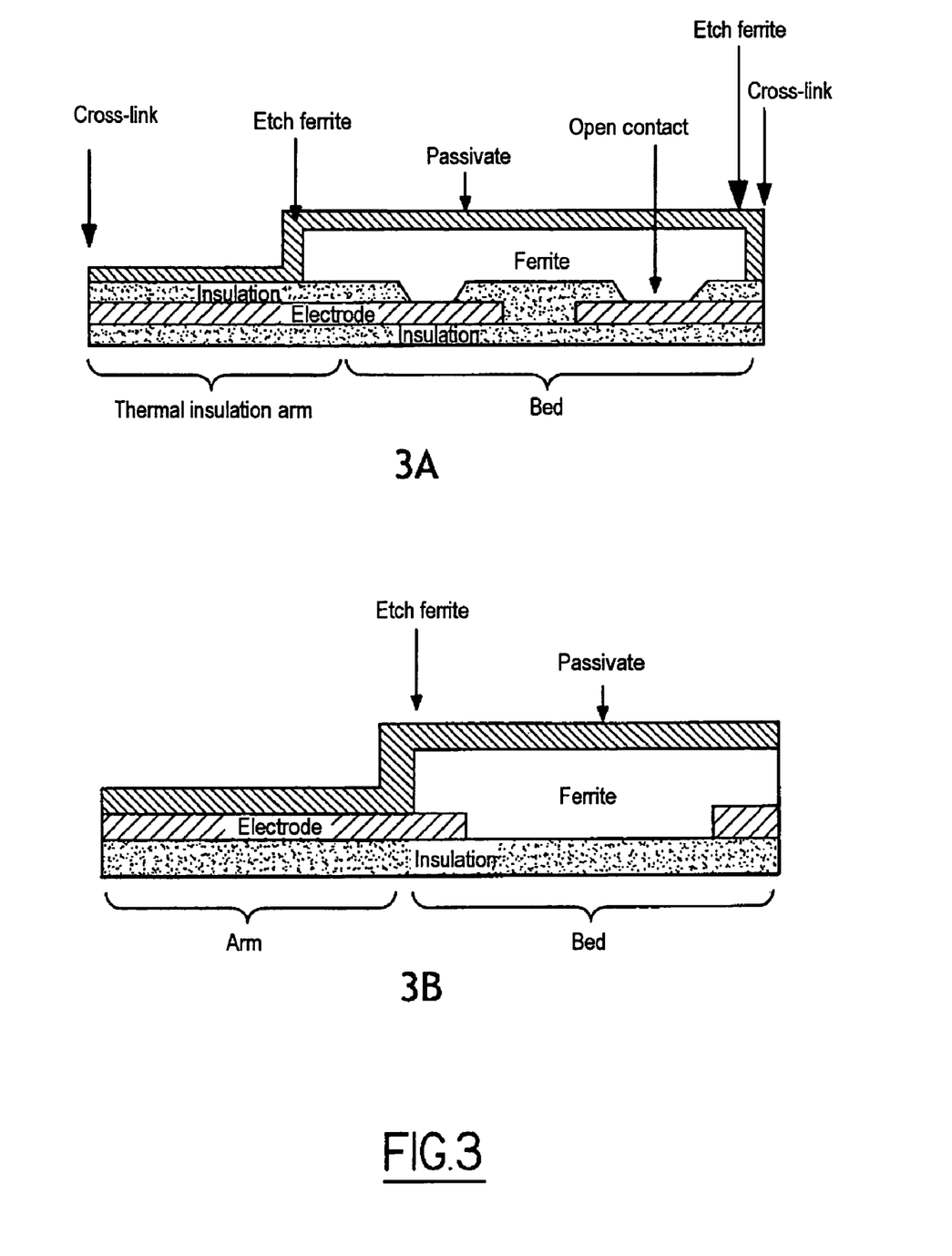
FIG. 3 shows two variant ways of integrating a thin film of material of the invention in a bolometric device of the invention.

FIG. 3 shows two variant ways of integrating a thin layer of material of the invention in a detector having coplanar electrodes.

In FIG. 3A, the structure supporting the ferrite is constituted by two insulating layers enclosing metal electrodes. The insulating layer deposited on the metal layer has contact openings so as to allow connections to be made to the sensitive element made of ferrite.

In FIG. 3B, the structure supporting the ferrite is constituted by a single insulating layer on which metal electrodes rest, which electrodes are directly in contact with the sensitive element made of ferrite. In this configuration, it can be advantageous to place an infrared-absorbing layer on one of the faces of the structure.

In these two variant embodiments, the ferrite can be etched to clear material from the region of each isolating arm and from the regions between detectors.

These two embodiments lead advantageously to a component that is optimized in terms of signal-to-noise ratio.

Naturally, bolometric devices in accordance with the invention may comprise a plurality of sensors in the form of a matrix array of pixels. Such an array of sensors may be connected, for example, to a charge-coupled device (CCD) or a complementary metal oxide on silicon (CMOS) matrix. With a suitable imaging system, the device of the invention then constitutes an infrared camera.

Bolometric devices of the invention can also be integrated in so-called monolithic structures that are fabricated in collective manner by the microelectronic methods that have been developed for silicon.

Thus, monolithic infrared imagers operating at ambient temperature can be manufactured by directly connecting a matrix of sensitive elements to a CMOS or CCD type multiplexer circuit. The supporting substrate may be constituted by an integrated electronic circuit comprising not only stimulation and read devices, but also multiplexer components for serializing the signals coming from the various detectors and for transmitting them to a small number of outputs in order to be used by a conventional imaging system.

In such devices, the insulating supports are made in the form of thin layers, e.g. of thickness lying in the range 5 nm to 100 nm. These insulating elements (e.g. SiN, SiO, ZnS, etc.) are obtained using the low-temperature deposition techniques commonly use for these materials, such as cathode sputtering or plasma enhanced chemical vapor deposition (PECVD). These materials are generally etched by plasma enhanced chemical etching methods.

The metal materials constituting the electrodes (e.g. Ti, TiN, Pt, etc.) are preferably deposited by cathode sputtering. The shapes of the electrodes are defined by chemical etching methods or by plasma. The thickness of the electrodes lies in the range 5 nm to 100 nm, for example. The electrodes which extend in the isolating arms are connected to the input stage of the read circuit by conventional contact-making methods, and they are adapted to the structure of the microbridge (analogous to the anchor points 11 in FIG. 2).

The material is deposited as a thin layer of the invention, using one of the techniques described above. It can be etched chemically (HCl, $H_3PO_4$), or by specific plasma etching methods, or indeed by ion machining.

The invention also provides a method of detecting infrared radiation or of producing infrared imaging by means of a bolometric device capable of absorbing incident radiation, of converting it into heat, and of communicating a fraction of the heat produced to a sensitive element of resistivity that varies with temperature, in which said device is as defined above.

The device of the invention can be used in numerous fields of application, for example in the military field (aiming devices and night viewing devices), in the industrial field (inspecting parts), in the security field (detecting fires, finding victims in smoke, night-time surveillance of sites, providing assistance in driving vehicles at night), or in the medical field (mapping blood circulation, mammography, etc.).

The examples and figures below are given by way of illustration and they do not limit the field of the invention.

EXAMPLE 1

Thin Layers of Magnetite $Fe_3O_4$

Particles of magnetite $Fe_EO_4$ were prepared by precipitating iron hydroxides in a basic medium. The solution including the precipitate was maintained under a flow of air at 70° C. for four days. The oxide $Fe_3O_4$ was formed progressively by oxidation and dehydration of the initial hydroxide. After the precipitate had been washed and dried, the particles were subjected to calcining at 90° C. under a nitrogen atmosphere in order to reduce their specific surface area.

At the end of that treatment, the powder was mixed with an organic binder (polyvinyl alcohol) in the following proportions by weight: 80% magnetite, 16% water, 4% polyvinyl alcohol. Thereafter, the powder was pressed under a pressure of 55 (metric) tonnes in a 10 centimeter (cm) matrix using a hydraulic press. The resulting raw compact was densified by sintering at 950° C. under a nitrogen atmosphere in order to avoid forming any $\alpha$-$Fe_2O_3$ oxide.

The thin layer was prepared in a cathode sputtering unit of type SCM400 (Alcatel CIT), operating in RF mode. The substrate was silicon covered in a 1 µm thick layer of $SiO_2$. The ferrite was deposited under the following conditions:
  argon plasma;
  pressure in enclosure: 0.5 Pa;
  target-substrate distance: 5 cm;
  RF power density: 3.1 watts per square centimeter $W/cm^2$;
  without magnetron;
  deposition rate: 4.5 nm/min.

The desired thicknesses were obtained by varying deposition times:
  example 1a, thickness=50 nm, deposition time=11 min;
  example 1b, thickness=100 mm, deposition time=22 min.

X-ray analysis showed that the thin layers were constituted by a pure spinel phase of $Fe_3O_4$. The electrical properties of the films in the raw state after deposition were as follows:

|  | Example 1a | Example 1b |
| --- | --- | --- |
| Thickness (nm) | 50 | 100 |
| Resistivity (ohm. cm) | 0.012 | 0.021 |
| Alpha (%. $K^{-1}$) | −1.2 | −1.2 |

Figure 1:
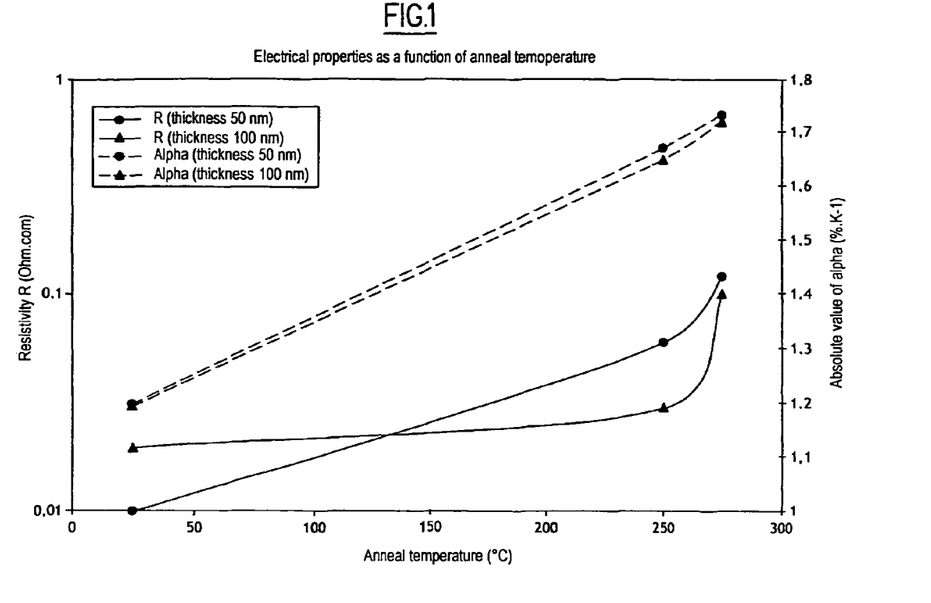
FIG. 1 is a graph showing variations in the resistivity and in a for the thin layer described in example 1, plotted as a function of the temperature of the oxidizing heat treatment, for various thicknesses.

The electrical properties were modified by heat treatments in air (treatment duration: 2 h) serving to modify the quantity of cationic vacancies in the spinel structure. The results are shown in FIG. 1 which shows that such oxidation treatments serve to improve the sensitivity $\alpha$.

EXAMPLE 2

Thin Layers of Magnetite $Fe_3O_{4+\delta}$

Thin layers of magnetite $Fe_3O_4$ were prepared using a method analogous to that described in Example 1. The substrates were identical, but the deposition conditions were different, being as follows:
  argon plasma;
  pressure in enclosure: 2 Pa;
  target-substrate distance: 5 cm;
  RF power density: 0.75 $W/cm^2$;
  with magnetron;
  deposition thickness: 100 nm.

X-ray analysis showed that the thin layers were constituted by a spinel phase of pure $Fe_3O_4$. A sample was maintained in the raw deposition state (Example 2a) while two other samples were processed in air respectively at 175° C. (Example 2b) and 250° C. (Example 2c) for 2 h in order to form $Fe_3O_{4+\delta}$.

The electrical properties of the films were as follows:

|  | Example 2a | Example 2b | Example 2c |
| --- | --- | --- | --- |
| Treatment | raw | 175° C. | 250° C. |
| Resistivity (ohm. cm) | 1.6 | 27.6 | 715 |
| Alpha (%.$K^{-1}$) | −1.9 | −3.9 | −4.5 |

EXAMPLE 3

Thin Layers of $Fe_{1.25}Co_{0.67}CH_{0.27}Mn_{0.81}O_{4+\delta}$

The ferrite powder was obtained by co-precipitation of hydroxides from nitrates of cobalt, copper, manganese, and iron precipitated in triethylamine. The method of obtaining the sintered target was analogous to that of Example 1. The sintering temperature was 900° C.

The thin layers were deposited on a 1.2 mm thick glass substrate. Deposition conditions were as follows:
  argon plasma;
  pressure in enclosure: 0.5 Pa;
  target-substrate distance: 5 cm;
  RF power density: 2 $W/cm^2$;
  with magnetron;
  thickness of deposit: 300 nm.

After heat treatment in air at 300° C. for 2 h, the electrical properties of the film were as follows:
  resistivity=1150 ohm·cm;
  alpha=−2.7%·$K^{-1}$.

EXAMPLE 4

Thin Layers of $Fe_{2.4}Co_{0.3}Zn_{0.3}O_4$

The appropriate quantities of the oxides (0.11 moles of ZnO; 0.11 moles CuO, and 0.44 moles of $Fe_2O_3$) were mixed together and ground finely. The powder was calcined at 750°

C. The method of obtaining the sintered target was analogous to that of Example 1. The sintering temperature was 900° C.

The thin layers were deposited on a 1.2 mm thick glass substrate. Deposition conditions were as follows:
argon plasma;
pressure in enclosure: 0.5 Pa;
target-substrate distance: 5.5 cm;
RF power density: 2.75 W/cm²;
without magnetron;
thickness of deposit: 125 nm.

The electrical properties of the film in the deposition raw state were as follows:
resistivity=0.28 ohm·cm;
alpha=−1.1%·K⁻¹.

The invention claimed is:

1. A method of bolometric detection of infrared radiation, comprising:
converting a change in temperature from heat produced by the infrared radiation into a change in resistivity of a thin layer of a sensitive material by bolometric detection, and
detecting the infrared radiation by using the sensitive material, the sensitive material having a spinel ferrite structure of chemical composition, ignoring doping agents if any are present, satisfying empirical formula I:

$$Fe_{3-(x+y)}M_xA_yO_{4+\delta} \qquad (I)$$

in which iron is the majority metallic element;
M represents a metal or a combination of two or more transition metals other than iron;
A represents at least one metal selected from magnesium and aluminum;
the metals and the oxygen being in the form of ions;
x represents the number of metal ions M, whether identical or different metals;
y represents the number of metal ions A;
x may be 0;
y is in the range 0 to 0.5; and
δ represents 0 or a positive number that is sufficiently small for the substance of formula I to contain at least one metal present in the form of ions having two different oxidation states and situated on a same sublattice of the spinel ferrite structure,
wherein the thickness of the thin layer of the sensitive material is in the range of 5 nm to 500 nm.

2. The method according to claim 1, wherein M is a metal selected from Co, Cu, Mn, Zn, Ni, V, Cr, Mo, W, Ti, Zr, Hf, and rare earths, presenting an ionic radius compatible with being integrated in the spinel structure, or a combination thereof.

3. The method according to claim 2, wherein M represents a metal selected from Co, Cu, Mn, Ni, Zn, and Ti, or a combination thereof.

4. The method according to claim 1, wherein M represents a metal selected from Co, Cu, Mn, Ni, Zn, and Ti, or a combination thereof.

5. A bolometric device for detecting infrared radiation or for infrared imaging, the device comprising at least one sensor provided with a sensitive element in the form of a thin layer,
wherein the at least one sensor converts a change in temperature from heat produced by the infrared radiation into a change in resistivity of the sensitive element by bolometric detection, and
wherein the sensitive element has a spinel ferrite structure of chemical composition, ignoring doping agents if any are present, satisfying empirical formula I:

$$Fe_{3-(x+y)}M_xA_yO_{4+\delta} \qquad (I)$$

in which iron is the majority metallic element;
M represents a metal or a combination of two or more transition metals other than iron;
A represents at least one metal selected from magnesium and aluminum;
the metals and the oxygen being in the form of ions;
x represents the number of metal ions M, whether identical or different metals;
y represents the number of metal ions A;
x may be 0,
y is in the range 0 to 0.5; and
δ represents 0 or a positive number that is sufficiently small for the substance of formula I to contain at least one metal present in the form of ions having two different oxidation states and situated on a same sublattice of the spinel ferrite structure,
wherein the thickness of the thin layer is in the range of 5 nm to 500 nm.

6. A bolometric device according to claim 5, wherein said sensor, inserted in a packet including an inlet window that is transparent to infrared, comprises a membrane that absorbs infrared radiation and converts the infrared radiation into heat, said membrane being disposed in such a manner as to be exposed to incident infrared radiation that has passed through the inlet window, and in such a manner as to transmit a fraction of the heat to said sensitive element.

7. A device according to claim 6, comprising a plurality of said sensors in the form of an array of pixels.

8. A device according to claim 7, wherein said array is connected to a CCD or CMOS matrix.

9. A device according to claim 5, comprising a plurality of said sensors in the form of an array of pixels.

10. A device according to claim 9, wherein said array is connected to a CCD or CMOS matrix.

11. A device according to claim 5, wherein the thickness of the sensitive layer is in the range of 10 nm to 500 nm.

12. A method of detecting infrared radiation or of producing infrared imaging using a bolometric device, the method comprising:
absorbing incident radiation using the bolometric device,
converting the incident radiation into heat, and
communicating a fraction of the heat produced to a sensitive element of resistivity that varies with temperature within the bolometric device,
wherein the bolometric device comprises at least one sensor provided with the sensitive element in the form of a thin layer, and
wherein the sensitive element has a spinel ferrite structure of chemical composition, ignoring doping agents if any are present, satisfying empirical formula I:

$$Fe_{3-(x+y)}M_xA_yO_{4+\delta} \qquad (I)$$

in which iron is the majority metallic element;
M represents a metal or a combination of two or more transition metals other than iron;
A represents at least one metal selected from magnesium and aluminum;
the metals and the oxygen being in the form of ions;
x represents the number of metal ions M, whether identical or different metals;
y represents the number of metal ions A;
x may be 0;

y is in the range 0 to 0.5; and

δ represents 0 or a positive number that is sufficiently small for the substance of formula I to contain at least one metal present in the form of ions having two different oxidation states and situated on a same sub-lattice of the spinel ferrite structure, wherein the thickness of the thin layer is in the range of 5 nm to 500 nm.

13. The method of detecting infrared radiation or of producing infrared imaging according to claim 12, wherein the sensor, inserted in a packet including an inlet window that is transparent to infrared, comprises a membrane that absorbs infrared radiation and converts the infrared radiation into heat, said membrane being disposed in such a manner as to be exposed to incident infrared radiation that has passed through the inlet window, in such a manner as to transmit a fraction of the heat to said sensitive element.

14. The method of detecting infrared radiation or of producing infrared imaging according to claim 13, wherein the bolometric device comprises a plurality of sensors in the form of an array of pixels.

15. The method of detecting infrared radiation or of producing infrared imaging according to claim 14, wherein the array is connected to a CCD or CMOS matrix.

16. The method of detecting infrared radiation or of producing infrared imaging according to claim 12, wherein the bolometric device comprises a plurality of sensors in the form of an array of pixels.

17. The method of detecting infrared radiation or of producing infrared imaging according to claim 16, wherein the array is connected to a CCD or CMOS matrix.

* * * * *